(12) United States Patent
Kuhn et al.

(10) Patent No.: US 6,910,161 B2
(45) Date of Patent: Jun. 21, 2005

(54) DEVICE AND METHOD FOR REDUCING THE NUMBER OF ADDRESSES OF FAULTY MEMORY CELLS

(75) Inventors: Justus Kuhn, München (DE); Peter Weitz, Sauerlach (DE)

(73) Assignee: Infineon Technologies AG, Munich (DE)

( * ) Notice: Subject to any disclaimer, the term of this patent is extended or adjusted under 35 U.S.C. 154(b) by 500 days.

(21) Appl. No.: 10/016,863

(22) Filed: Dec. 14, 2001

(65) Prior Publication Data

US 2002/0087926 A1 Jul. 4, 2002

(30) Foreign Application Priority Data

Dec. 14, 2000 (DE) .......................................... 100 62 404

(51) Int. Cl.[7] .......................... G11C 29/00; G11C 16/06
(52) U.S. Cl. .................. 714/710; 714/718; 365/185.09
(58) Field of Search ............................ 365/201, 185.09; 714/710, 718, 719; 711/128

(56) References Cited

U.S. PATENT DOCUMENTS 6,725,403 B1 * 4/2004 Schmoelz ................... 714/723

OTHER PUBLICATIONS

Haddad, R. et al.: "Increased Throughput for the Testing and Repair of RAM's with Redundancy", IEEE, vol. 40, No. 2, Feb. 1991, pp. 154–166.

* cited by examiner

*Primary Examiner*—Guy J. Lamarre
*Assistant Examiner*—Cynthia Britt
(74) *Attorney, Agent, or Firm*—Laurence A. Greenberg; Werner H. Stemer; Ralph E. Locher

(57) ABSTRACT

A method and a device for reducing addresses of faulty memory cells compare addresses of faulty memory cells, as first fault addresses, with addresses of word lines or bit lines which are to be completely repaired, these addresses are referred to as second fault addresses. If the first fault address corresponds to the second fault address, the first fault address is deleted and not further processed. In a second comparison, it is determined, by reference to the number of non-deleted first fault addresses, whether an address of a word line or bit line is used as a new second fault address for the first comparison method. The number of addresses of faulty memory cells are thus reduced.

2 Claims, 3 Drawing Sheets

DEVICE AND METHOD FOR REDUCING THE NUMBER OF ADDRESSES OF FAULTY MEMORY CELLS

BACKGROUND OF THE INVENTION

Field of the Invention

The invention relates to a method and a device for reducing the number of addresses of faulty memory cells of a memory array. These addresses are determined when the operability of the memory cells of the memory array is checked. The device and the method are used in particular in a semiconductor memory with a memory cell field which is provided in the form of a matrix.

When the operability of memory cells of a semiconductor memory is checked, a large number of addresses which identify faulty memory cells is determined due to the large number of memory cells. The large number of addresses requires a large memory area and a considerable outlay for storing and processing the addresses.

SUMMARY OF THE INVENTION

It is accordingly an object of the invention to provide a method and a device for reducing the number of addresses to be stored and further processed when memory cells of a memory array are checked which overcome the above-mentioned disadvantages of the heretofore-known methods and devices of this general type.

With the foregoing and other objects in view there is provided, in accordance with the invention, a method for reducing a number of addresses to be stored and further processed when memory cells of a memory array are checked, the method includes the steps of:

further processing an address of a memory cell having been detected as faulty during a test method, as a first fault address;

comparing the first fault address, in a first comparison process, with a second fault address, the second fault address constituting an address of at least one of a word line and a bit line to be completely repaired;

neither storing nor further processing the first fault address, if the first fault address corresponds to the second fault address; and storing the first fault address, if the first fault address and the second fault address do not correspond.

An advantage of the invention is that the addresses of memory cells which have been detected as faulty during a test method are further processed as fault addresses and are compared with two fault addresses in a first comparison method. The second memory addresses represent addresses of word line sections and/or bit line sections which are to be completely repaired. Word line sections and bit line sections refer to the areas of a word line or bit line which usually are, or have to be, completely replaced.

If the result of the comparison in the first comparison method is that the first fault addresses and the second fault addresses correspond, the first fault addresses are not further processed any more and preferably deleted.

Another mode of the invention, includes the steps of checking, in a second comparison process, whether more than a given number of first fault addresses of a bit line and/or a word line is stored for a word line and/or a bit line; detecting an address of the word line and/or the bit line for which more than the given number of first fault addresses is stored, as a further new second fault address; and taking the further new second fault address into account in subsequent first comparison processes.

Further advantageous embodiments of the invention are defined in the dependent claims. The first fault addresses which do not correspond to the second fault addresses in the first comparison method are checked in each case for a word line section and/or bit line section to determine whether a predefined number of first fault addresses is exceeded per word line section and/or bit line section. If this is the case, the corresponding word line section and/or bit line section is detected as being a word line section and/or bit line section which has to be completely repaired, and taken into account as a new second fault address in further first comparison processes. In this way, the second fault addresses are continuously updated and the first fault addresses which have to be stored and further processed are thus continuously reduced in number.

A complete address (a bit address and a word address) of a faulty memory cell is preferably used as the first fault address.

Depending on the embodiment of the memory array to be checked, the predefinable number of addresses of the faulty memory cells for the second comparison method differs for the word line sections and for the bit line sections. In this way, the method according to the invention can be adapted to the different number of replacement bit line sections and replacement word line sections for a word line section and for a bit line section.

In a further preferred embodiment, a plurality of bit lines which are combined to form a bit line block are identified with a single bit block address. In this way, the number of first fault addresses is reduced, and the method is therefore simplified.

In a further advantageous embodiment, a plurality of word lines are combined in one word line block and identified with one word block address. In this way, the number of first and second fault addresses for word lines is reduced. As a result, the method according to the invention is simplified and can be processed more quickly.

One preferred embodiment of the device according to the invention uses a first comparison unit with two rows of registers in which the first comparison method is carried out.

With the objects of the invention in view there is also provided, a device for reducing a number of addresses of faulty memory cells, including:

an arithmetic unit having a memory including word lines, bit lines and memory cells with respective addresses;

the arithmetic unit further processing, as first fault addresses, the addresses of given ones of the memory cells having been detected as faulty in a test;

the arithmetic unit comparing the first fault addresses with second fault addresses in a first comparison process, the second fault addresses constituting addresses of given ones of the word lines and the bit lines which are to be completely repaired; and the arithmetic unit not storing a respective one of the first fault addresses, if the respective one of the first fault addresses corresponds to a respective one of the second fault addresses, and the arithmetic unit storing the respective one of the first fault addresses, if the respective one of the first fault addresses does not correspond to the respective one of the second fault addresses.

According to another feature of the invention, the arithmetic unit checks, in a second comparison process, whether more than a given number of the first fault addresses of one of the bit lines and the word lines is stored for one of a word line and a bit line, the arithmetic unit stores, as a new further second fault address, the address of the one of the word line and the bit line for which more than the given number of first fault addresses are stored and taking the new further second fault address into account in subsequent first comparison processes.

According to yet another feature of the invention, the arithmetic unit has a first comparison unit, the first comparison unit has a first row of serially connected registers and a second row of serially connected registers, each of the registers in the first row is assigned to a respective one of the registers in the second row; the first comparison unit has a clock input for receiving a clock signal; a first one of the registers in the first row is configured to be supplied with a first fault address, the first row of serially connected registers is configured such that the first fault address is shifted forward by a respective one of the registers in the first row at each clock signal; and the first comparison unit comparing, between clock signals, in each case the addresses of assigned ones of the registers of the first row and the second row and deleting an address of one of the registers of the first row, if the addresses of the assigned ones of the registers of the first row and the second row correspond.

According to another feature of the invention, the arithmetic unit has a second comparison unit, the second comparison unit has a third row of serially connected registers and a fourth row of serially connected registers, each of the registers in the third row is assigned to a respective one of the registers in the fourth row; the second comparison unit has a clock input for receiving a clock signal; a first one of the registers in the fourth row is configured to be supplied with a first fault address after the clock signal; the fourth row of serially connected registers is configured such that the first fault address is shifted forward by a respective one of the registers in the third row at each clock signal; the second comparison unit comparing, between clock signals, in each case the addresses of assigned ones of the registers of the third row and the fourth row and deleting an address of one of the registers of the fourth row, if the addresses of the assigned ones of the registers of the third row and the fourth row correspond; the second comparison unit reading an address of one of the registers of the fourth row into an assigned one of the registers of the third row if the assigned one of the registers of the third row is detected as being empty during a comparison; the second comparison unit serially reading into the first row and processing, in a given operation, the first fault addresses of at least one of a word line and a bit line, the second comparison unit checking, after performing the given operation, whether more than a given number of the serially connected registers of the third row is occupied; and the arithmetic unit writing an address of one of a checked one of the word lines and a checked one of the bit lines into a free one of the serially connected registers of the second row as a further new second fault address.

Other features which are considered as characteristic for the invention are set forth in the appended claims.

Although the invention is illustrated and described herein as embodied in a device and a method for reducing the number of addresses of faulty memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
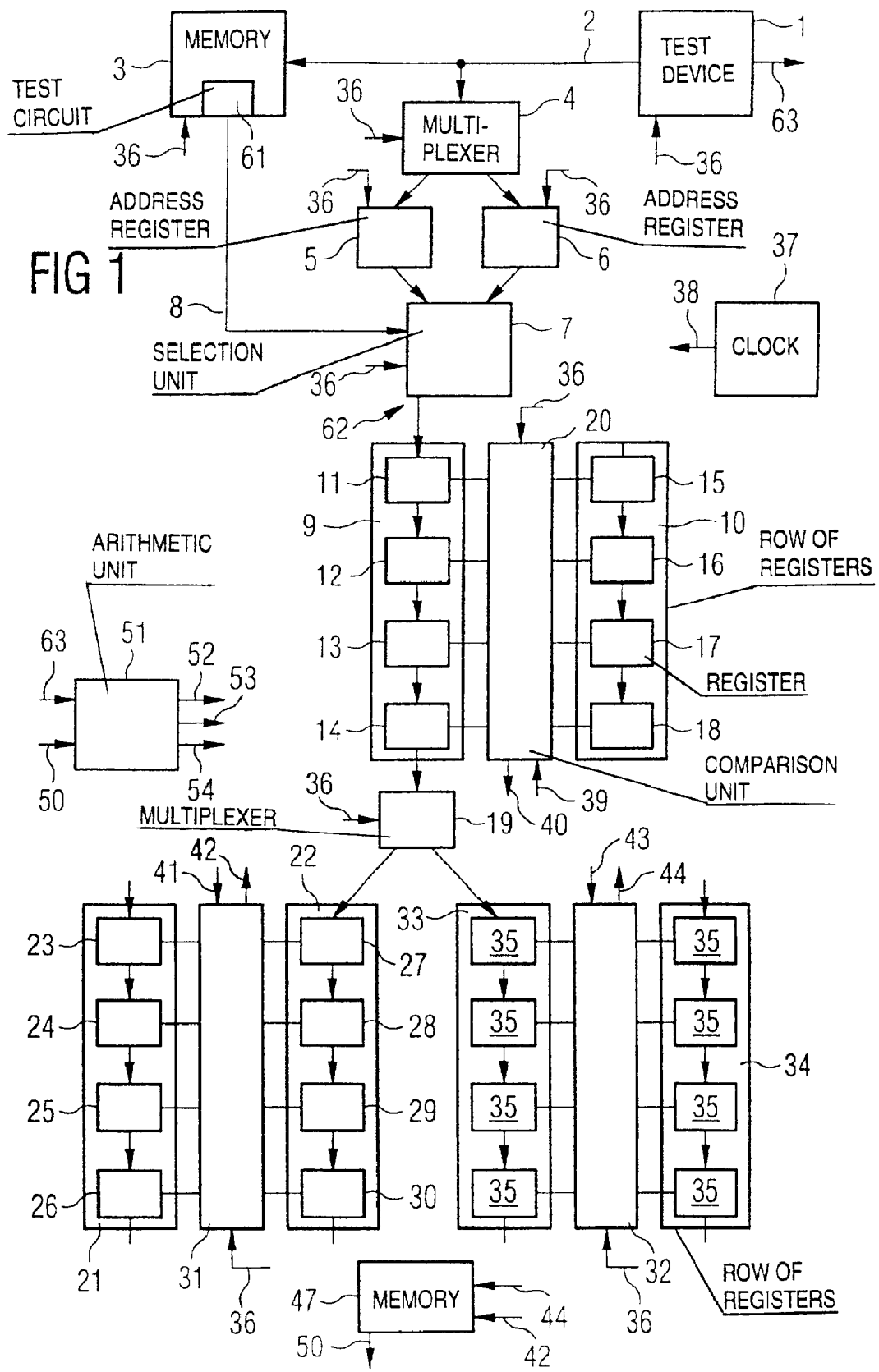
FIG. 1 is a block diagram of a device for carrying out the method according to the invention.

Referring now to the figures of the drawings in detail and first, particularly, to FIG. 1 thereof, there is shown a memory array 3 which is connected to a test device 1 via a test line 2. The memory array 3 has an output which is connected to a unit 7 via a first output line 8. The memory array 3 has a clock input 36 which is connected to a clock output 38 of a clock generator 37. The test line 2 is also connected to a first multiplexer 4.

The first multiplexer 4 has two outputs, one output being connected to an input of the first address register 5 and a further output being connected to an input of a second address register 6. The first address register 5 is connected via an output to the unit 7. The second address register 6 is also connected via an output to a further input of the unit 7. The unit 7 is connected by an output to a first row 9 of serially connected registers 11, 12, 13, 14. The first row 9 has a first, second, third and fourth register 11, 12, 13, 14. The fourth register 14 of the first row 9 is connected via an output to a second multiplexer 19.

Furthermore, a second row 10 is connected to a fifth, sixth, seventh, eighth register 15, 16, 17, 18. The registers 15, 16, 17, 18 of the second row 10 are also connected in series. A first comparison unit 20 is provided between the first and second rows 9, 10 and is connected to all the registers of the first and second rows 9, 10. The first comparison unit 20 has a first output 40, a first input 39 and a clock input 36.

Furthermore, an arithmetic unit 51 is provided which is connected to a memory 47 via a data line 50, and to the first input 39 of the first comparison unit 20 via a seventh output 52.

The second multiplexer 19 has a clock input 36 and two outputs which are connected to a fourth row 22 and to a fifth row 33 of registers 27, 28, 29, 30, 35. The fourth row 22 has a ninth, tenth, eleventh and twelfth register 27, 28, 29, 30. A second comparison unit 31 is assigned to the fourth row 22 and is connected to all the registers of the fourth row 22. The registers of the fourth row 22 are serially connected.

Furthermore, a third row 21 with a thirteenth register 23, a fourteenth register 24, a fifteenth register 25 and a sixteenth register 26 is provided.

The second comparison unit 31 is connected to all the registers of the third and fourth rows 21, 22. The second comparison unit 31 has a clock input 36, a second input 41 and a second output 42.

The fifth row 33 is constructed with the four registers 35, so as to correspond to the fourth row 22. Furthermore, a sixth row 34 with four registers 35 is provided, which row 34 is constructed so as to correspond to the third row 21. The registers 35 of the fifth and sixth rows 33, 34 are connected to a third comparison unit 32 which has a clock input 36, a third input 43 and a third output 44. The configuration of the fifth and sixth rows 33, 34 with the third comparison unit 32 is analogous in terms of the configuration and method of operation to the configuration of the third and fourth rows 21, 22 with the second comparison unit 31, the invention being described below only with reference to the third and fourth rows 21, 22.

The arithmetic unit 51 is connected via an eighth output 53 to the second input 41 of the second comparison unit 31.

Furthermore, the arithmetic unit 51 has a ninth output 54 which is connected to the third input 43 of the third comparison unit 32.

The clock generator 37 has a clock output 38 which is connected to the clock input 36 and which sets a reference time.

The method of operation of the device in FIG. 1 is explained in more detail below. The test device 1 serially transmits, via the test line 2, column addresses and row addresses of memory cells of the memory array 3, which are to be tested for a correct method of operation, to the memory array 3. The type of function to be checked is predefined by the test device 1 through the use of corresponding control signals. In one preferred exemplary embodiment, the checking of the correct method of operation of the addressed memory cells is carried out by the memory array 3 itself through the use of test circuits 61. If the result of the checking of the memory cell which is identified by the address of the word line or bit line is that the memory cell is faulty, a fault signal is transmitted to the unit 7 via the first output line 8. In parallel with the checking of the addressed memory cell, the word addresses and bit addresses are transmitted from the test line 2 to the first multiplexer 4. The first multiplexer 4 sends the word addresses to the first address register 5 and the bit addresses to the second address register 6. The first and second address registers 5, 6 are constructed as a shift register with an adjustable depth. The addresses of the word lines and bit lines are further processed in synchronism with the checking of the operational capability of the addressed memory cells in such a way that the corresponding address of the word line and bit line is always present at the input of the unit 7 if the corresponding signal for correct operational capability or for faulty operational capability is transmitted to the unit 7. If the unit 7 receives, via the first output line 8, for example when a word and bit address is present, the information that the memory cell identified with the word and bit address is functioning correctly, the word and bit address are deleted in the first and second address registers 5, 6, respectively. However, if a fault signal is transmitted to the unit 7 via the first output line 8, at the next clock signal the unit 7 transmits the word and bit address present at the input to the first register 11 of the first row 9 via a twelfth output 62. The word and bit addresses are further processed by the first comparison unit 20.

For example, a word line section address (word and bit address) of a word line which is to be completely repaired, what is referred to as a second fault address, is stored in the fifth address of the second row 10. The first comparison unit 20 compares the address of the first register 11 with the address of the fifth register 15. If the result of the comparison is that the addresses correspond, the address of the first register 11 is deleted by the first comparison unit 20. However, if the result of the comparison is that the addresses of the first and fifth registers do not correspond, the address of the first register 11 is not deleted by the first comparison unit 20, but rather shifted on into the second register 12 at the next clock signal. At the same time, at the next clock signal a corresponding address is read into the first register 11 by the unit 7 if a fault signal is present for this address on the first output line 8 at the unit 7.

The first comparison unit 20 respectively compares, between two clock signals, the content of the first register with the content of the fifth register, the content of the second register 12 with the content of the sixth register 16, the content of the third register 13 with the content of the seventh register 17 and the content of the fourth register 14 with the content of the eighth register 18. If the result of the comparison is that the address of the register of the first row corresponds to the address of the corresponding register of the second row 10, the address of the register of the eighth row 9 is deleted.

After each clock signal, the address in the first row 9 is forwarded by one register. From the fourth register 14, the address is transferred to a second multiplexer 19 which writes the address into a register of a fourth or fifth row 22, 33.

In this exemplary embodiment, the address is written by the fourth register 14 into a ninth register 27 of the fourth row 22 through the use of the second multiplexer 19.

At the following clock signal, the second comparison unit 31 compares the content of the ninth register 27 with the content of the thirteenth register 23, the content of the tenth register 28 with the content of the fourteenth register 24, the content of the eleventh register 29 with the content of the fifteenth register 25 and the content of the twelfth register 30 with the content of the sixteenth register 26. If the result of the comparison is that the addresses correspond, the content of the register 27, 28, 29, 30 of the fourth row 22 is deleted. If the result of the comparison is that the register of the third row 21 does not have any content, the second comparison unit 31 transmits the content of the assigned register of the fourth row 22 into the content of the corresponding register of the third row 21.

At each clock signal, the address is shifted on in the fourth row 22 by one register 28, 29, 30 if the address is not deleted or is shifted into a register 23, 24, 25, 26 of the third row 21.

The addresses can be tested by the test device 1 word line by word line or bit line by bit line or word line section by word line section or bit line section by bit line section, respectively, or in any desired fashion. The test device 1 outputs, at an eighth input 63 of the arithmetic unit 53, the information that a new redundancy-compatible bit line section or word line section is being tested. The test device 1 optionally transmits to the arithmetic unit 51 the complete address of the bit line section or word line section to be tested. The arithmetic unit 51 sends a corresponding signal for the start and the end of the checking of a word line or of a bit line to the second and third comparison unit 31, 32 via the seventh, eighth and ninth output 52, 53, 54.

When the signal is received that a new word line section or bit line section is being tested, the unit 7 receives a corresponding signal from the arithmetic unit 51 so that no further addresses are read into the first row 9. The addresses which are already contained in the first row 9 are then shifted through the registers of the first row 9 until the last address has reached the fourth row 22. If the last address has reached the fourth row 22, the second multiplexer 19 switches its output over to the fifth row 33. All the addresses up to the last address are then shifted by the registers of the fourth row 22 and handled by the second comparison unit 31 in accordance with the method described above.

In one advantageous embodiment, at the changeover of the word line sections or bit line sections, the datastream of the first row 9 is not interrupted but rather the second multiplexer 19 is synchronized with the datastream and then switches over between the fourth row 22 and the fifth row 33 if the last address of the old word line section or bit line section has been transferred into the fourth row 22, and the first address of the new word line section or bit line section is still in the first row 9. The registers of the third and fourth rows 21, 22 are then reset to the value 0. The addresses of the word line section or bit line section which is to be newly checked are read into the first row 9 via the unit 7 in accordance with the method described and after the checking by the first comparison unit 20 they are fed to the fifth row 33 via the second multiplexer 19 in accordance with the method described.

The second or third comparison unit 31, 32 checks whether addresses are stored in more than a predefined number of registers of the third or sixth row 21, 34. If this is the case, the second or third comparison unit 31, 32 sends a corresponding overflow signal to the arithmetic unit 51. If the arithmetic unit 51 receives an overflow signal, the arithmetic unit 51 transmits the address of the word or bit line just checked to the first comparison unit 20 as a new second fault address, the first comparison unit 20 writing the new second fault address into a free register of the second row 10. The second and third comparison unit 31, 32 then delete the content of the registers of the third, fourth, fifth and sixth rows 21, 22, 33, 34.

If the result of the checking by the second or third comparison unit 31, 32 is that less than the predefined number of registers of the third or sixth rows 21, 34 are occupied by addresses, the addresses which are stored in the registers of the third or sixth row 21, 31 are transmitted into the memory 47 by the second or third comparison unit 31, 32. To do this, the second output 42 and the fourth output 44 are connected to the memory 47.

If an entire memory array has been checked, the test device 1 sends a corresponding termination signal to the arithmetic unit 51. In response, the arithmetic unit 51 sends a corresponding termination signal to the first comparison unit 20 which then transmits all the second fault addresses which are stored in the second row 10 into the memory 47. However, it is ensured that all the first fault addresses have been read into the fourth row 32 or fifth row 33 via the second multiplexer 19 and have been compared with the contents of the registers of the third or sixth row 21, 34 before the termination signal is sent to the first comparison unit 20. This ensures that a correspondingly long overrun is carried out in the processing of the addresses by the first and second or third comparison unit 20, 31, 32 so that all the addresses have been processed by the first and second or first and third comparison unit 20, 31, 32. In this way, all the registers 11, 12, 13, 14 of the first row 9 are empty before the termination signal is fed to the first comparison unit. Before the termination signal is fed to the second and third comparison units 31, 32, all the registers of the fourth and fifth rows 22, 32 are processed, and therefore empty.

Each register of the first, second, third, fourth, fifth and sixth rows 9, 10, 21, 22, 33, 34 has a bit depth which corresponds to the length of the addresses of the word lines and bit lines used. The invention has been described with reference to rows having four serially connected registers in each case, but any desired number of registers in a serial configuration can be used. The number of registers of the first and second rows 9, 10 is preferably matched to the maximum number of word lines and bit lines which have be completely repaired. If more than the maximum possible number of word lines and/or bit lines to be repaired is detected during the checking of a memory array 3, the entire memory array 3 is identified as defective and eliminated.

The number of registers which are serially connected in the third, fourth, fifth and sixth rows 21, 22, 33, 34 are preferably matched to the maximum number of bit lines or word lines to be repaired for a bit line or word line. In this way, optimum matching of the number of registers per row is achieved.

The first fault addresses which constitute addresses of a word line or bit line of a faulty memory cell and the second fault addresses which constitute addresses of word lines or bit lines which are to be completely repaired are stored in the memory 47 after the checking of a memory array 3 and can be correspondingly taken into account for a further processing operation or for further test methods.

Figure 2:
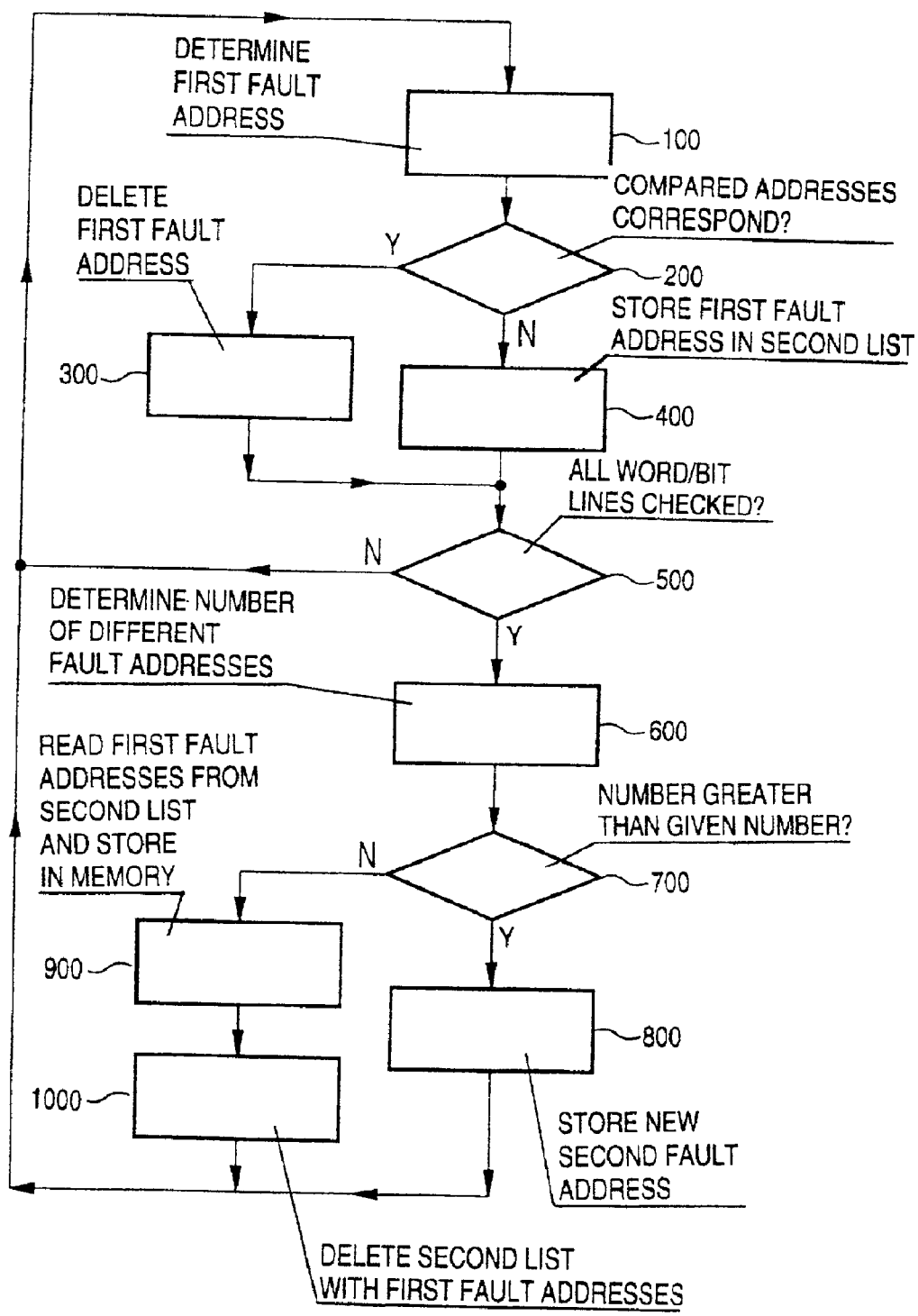
FIG. 2 is a flow chart illustrating the method sequence for carrying out the method according to the invention.

FIG. 2 shows a schematic program sequence of the method according to the invention, an address being determined as a first fault address at program point 100, the fault address addressing a memory cell via the selected word line or bit line. The address includes the word address and the bit address of the faulty memory cell. If the memory cells are organized in the form of memory cell blocks which are jointly replaced in the event of a repair, only one word address and bit address is provided for all the memory cells of a memory cell block. The first fault address can be determined either after a corresponding address of a word line and bit line is set by test circuits 61 through the use of a test device 1, the test circuits 61 being integrated on a memory array 3. However, the first fault address can also be determined by the test device 1 itself in that the test device 1 processes predefined test methods and compares the corresponding behavior of the memory array 3 with a prescribed behavior, and in the event of relatively large deviations detects a malfunction of the addressed memory cell of the memory array 3. In this way, a first fault address of a word line or bit line is detected, and is subsequently compared, at program point 200, with a first list of second fault addresses. In the selected exemplary embodiment, only a second fault address is stored in the first list of the second fault addresses. However, even when the program is started, the first list may still be empty. If the result of the comparison at program point 200 is that the first fault address does not correspond to one of the second fault addresses, the program branches to program point 400.

If the result of the comparison at program point 200 is that the first fault address corresponds to one of the second fault addresses, at the following program point 300 the first fault address is deleted and the program then branches to program point 500.

At program point 400, the first fault address is written into a second list of a memory. Then, at program point 500, there is the interrogation to determine whether all the bit lines of the selected word line or all the word lines of the select bit line have been checked. If this is not the case, the program then branches back to program point 100 and a new bit line or word line is selected.

If the result of the comparison at program point 500 is that all the bit lines of the selected word line or all the word lines of the selected bit line have been checked, and thus all the first fault addresses of a word line or all the first fault addresses of a bit line are stored in the second list in the memory, the program branches to program point 600. At program point 600, the arithmetic unit determines the number of different first fault addresses which are stored for the word line or bit line to be checked. Identical first fault addresses are deleted.

At program point 700 it is then checked whether the number of different first fault addresses for the selected word line or bit line exceeds the predefined number. If this is the case, the program branches to program point 800. At program point 800, the address of the word line or bit line which has just been checked is stored as a new second fault address in the first list in the memory, the second list is deleted and the program then branches back to program point 100 at which the next word line or bit line is selected.

If the result of the interrogation at program point 700 is that the number of first fault addresses for the word line or bit line is smaller than the predefined number, the program branches to program point 900. At program point 900, the first fault addresses are read out of the second list and stored in a memory 47. At program point 1000, the second list with the first fault addresses is then deleted and the program branches back to program point 100.

In a further embodiment of the invention, a word line section or a bit line section is respectively checked for faulty bit lines or word lines. In the course of this process, at program point 500, it is checked here whether all the word lines or bit lines of the word line section or bit line section have been checked. If this is not the case, the program branches back to program point 100 and a new bit line or a new word line is selected. If the result of the comparison at program point 500 is that all the bit lines or word lines of the word line section or bit line section to be checked have been checked, and all the first fault addresses of the word line section or of the bit line section are thus stored in the second list in the memory, the program branches to program point 600. At program point 600, the arithmetic unit determines the number of different first fault addresses of the word line section or bit line section to be checked.

At program point 700, the arithmetic unit checks whether the number of first fault addresses lies above a predefined number. If this is the case, the program branches to program point 800. At program point 800, the address of the word line section or bit line section which has just been checked is stored as a new second fault address in the first list in the memory, the second list is then deleted and the program then branches back to program point 100. At program point 100, a word line section or bit line section is again selected and checked.

If the result of the interrogation at program point 700 is that the number of first fault addresses for the word line section or the bit line section is smaller than the predefined number, the program branches to program point 900. At program point 900, the first fault addresses are read out of the second list and stored in the memory 47. At program point 1000, the second list with the first fault addresses is then deleted and the program branches back to program point 100.

The method according to the invention is not restricted to the exemplary embodiment illustrated in FIG. 2; in particular, parts of the method can be processed in parallel in terms of their timing. For example, the program steps 100 to 500 can be stored for a new address while addresses which have run through the program steps 100 to 500 are already being further processed in the program steps 600 to 1000. Furthermore, any individual configuration of the individual program steps is possible.

The method according to the invention is processed, for example, with a device according to FIG. 1. The number of fault addresses in which a word line or bit line is detected as a word line or bit line which is to be completely repaired, is adapted individually to the memory array 3 to be tested. For example, it is possible to use different predefined numbers for a word line than for a bit line.

After all the memory cells of a memory array have been checked, the addresses, stored in the first list, of the word lines and bit lines which are to be completely replaced and the first fault addresses, stored in the third list in the memory 47, of faulty word lines and bit lines are stored for further test methods so that they can be reused later. For example, the first and second fault addresses are used for a statistical evaluation of a multiplicity of tested memory arrays. The main application of the first and second fault addresses which are determined is the calculation of redundancy and the resulting determination of the word line sections and bit line sections to be replaced by redundant elements.

The method according to FIG. 2 uses, as first fault addresses, either the complete address of a word line or bit line or preferably the address of a word line block or of a bit line block. A plurality of word lines or bit lines which are all replaced when a word line or bit line of the word line block or bit line block is repaired are combined in a word line block or bit line block.

Figure 3:
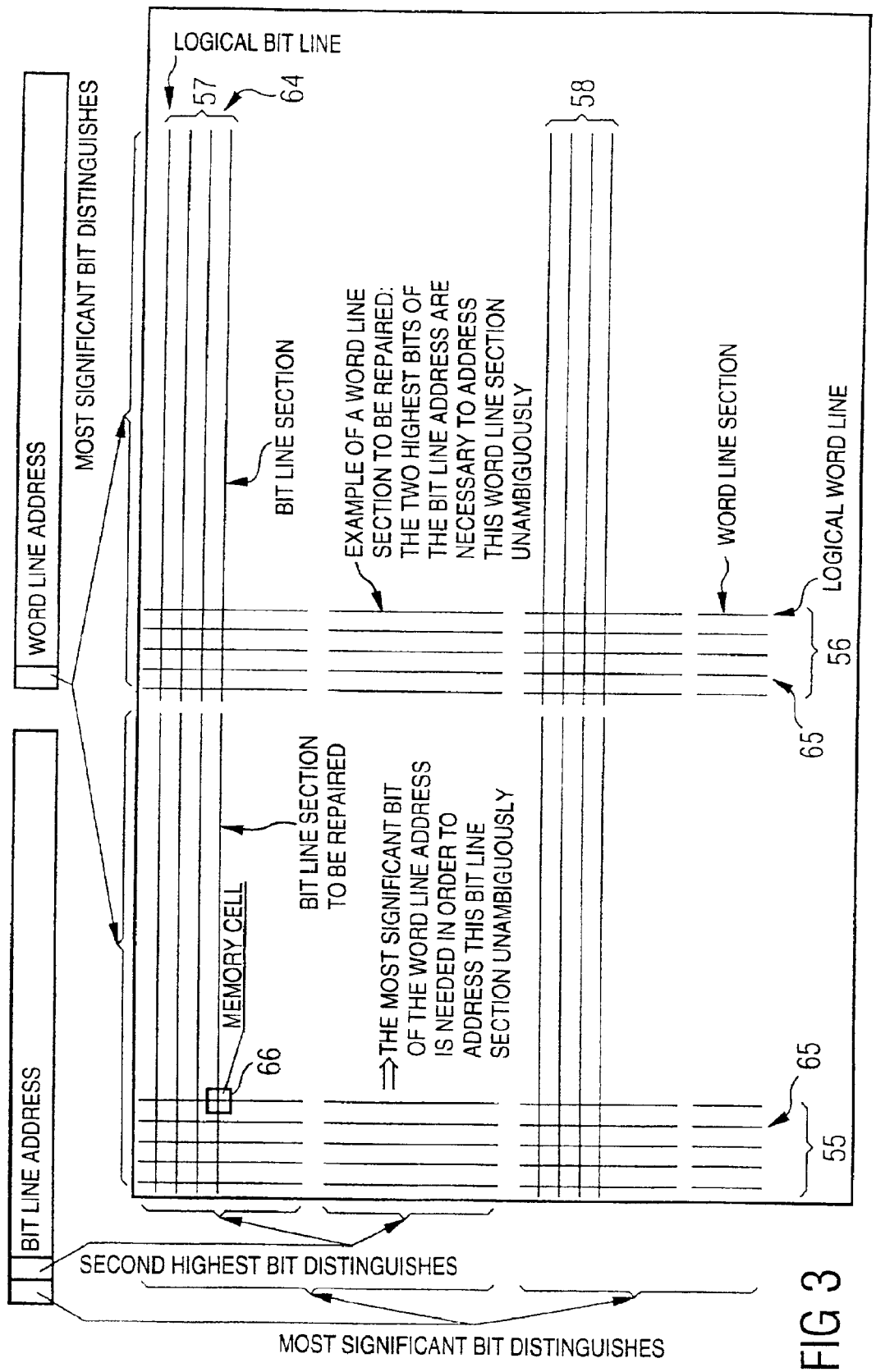
FIG. 3 is a schematic view of a part of a memory array with a bit line block and a word line block.

FIG. 3 shows a schematic view of a detail of a memory array with a plurality of bit lines 64 and a plurality of word lines 65. The memory cell 66 is connected to a word line 65 and a bit line 64. In this exemplary embodiment, in each case five word lines 65 are combined to form a first word line block 55 or second word line block 56. Furthermore, in each case four bit lines 64 are combined to form in each case a first bit line block 57 or second bit line block 58. The word lines or bit lines of a word line block or of a bit line block are always completely replaced when a word line or bit line is repaired. It is therefore sufficient if a single address, a bit block address, is used for the two bit lines of the first bit line block 57. Likewise, it is advantageous to use a single address, a word block address, for two word lines 65 of a word line block 55, 56.

Above the memory array in FIG. 3, individual bits of the bit line address and individual bits of the word line address are represented schematically. The most significant bit of the bit line address is used to address an upper half and a lower half. The second most significant bit is respectively used to address an upper part of the upper half and a lower part of the lower half of the memory array. Likewise, the most significant bit of the word line address is used to address a to left-hand half and a right-hand half of the memory array.

Thus, the most significant bit and the second most significant bit of the bit line address and in addition the most significant bit of the word line address are necessary for unambiguously addressing the left-hand upper region, for example. This bit line section or word line section is clearly identified only by the bit line address and the word line address.

The invention is not restricted to the device and method described in the exemplary embodiment but rather can also be applied in other embodiments of the device or of the method.

The device according to the invention and the method according to the invention are preferably used for testing memory arrays of a semiconductor memory which are constructed in the form of a matrix.

We claim:

1. A device for reducing a number of addresses of faulty memory cells in a memory cell array having word lines, bit lines and memory cells with respective addresses, the device comprising:

an arithmetic unit;

said arithmetic unit processing, as first fault addresses, the addresses of given ones of the memory cells having been detected as faulty in a test;

said arithmetic unit comparing the first fault addresses with second fault addresses in a first comparison process, the second fault addresses constituting addresses of given ones of the word lines and the bit lines which are to be completely repaired;

said arithmetic unit not storing a respective one of the first fault addresses, if the respective one of the first fault addresses corresponds to a respective one of the second fault addresses, and said arithmetic unit storing the respective one of the first fault addresses, if the respective one of the first fault addresses does not correspond to the respective one of the second fault addresses;

said arithmetic unit having a first comparison unit, said first comparison unit having a first row of serially connected registers and a second row of serially connected registers, each of said registers in said first row is assigned to a respective one of said registers in said second row;

said first comparison unit having a clock input for receiving a clock signal;

a first one of said registers in said first row is configured to be supplied with a first fault address, said first row of serially connected registers is configured such that the first fault address is shifted forward by a respective one of said registers in said first row at each clock signal;

said first comparison unit comparing, between clock signals, in each case the addresses of assigned ones of said registers of said first row and said second row and deleting an address of one of said registers of said first row, if the addresses of said assigned ones of said registers of said first row and said second row correspond;

said arithmetic unit having a second comparison unit, said second comparison unit having a third row of serially connected registers and a fourth row of serially connected registers, each of said registers in said third row is assigned to a respective one of said registers in said fourth row;

said second comparison unit having a clock input for receiving the clock signal;

a first one of said registers in said fourth row is configured to be supplied with the first fault address after the clock signal;

said fourth row of serially connected registers is configured such that the first fault address is shifted forward by a respective one of said registers in said third row at each clock signal;

said second comparison unit comparing, between clock signals, in each case the addresses of assigned ones of said registers of said third row and said fourth row and deleting an address of one of said registers of said fourth row, if the addresses of said assigned ones of said registers of said third row and said fourth row correspond;

said second comparison unit reading an address of one of said registers of said fourth row into an assigned one of said registers of said third row if said assigned one of said registers of said third row is detected as being empty during a comparison;

said second comparison unit serially reading into said first row and processing, in a given operation, the first fault addresses of at least one of a word line and a bit line, said second comparison unit checking, after performing the given operation, whether more than a given number of said serially connected registers of said third row is occupied; and said arithmetic unit writing an address of one of a checked one of the word lines and a checked one of the bit lines into a free one of said serially connected registers of said second row as a further new second fault address.

2. The device according to claim 1, wherein said arithmetic unit checks, in a second comparison process, whether more than a given number of the first fault addresses of one of the bit lines and the word lines is stored for one of a word line and a bit line, said arithmetic unit storing, as a new further second fault address, an address of the one of the word line and the bit line for which more than the given number of first fault addresses are stored and taking the new further second fault address into account in subsequent first comparison processes.

* * * * *